(12) United States Patent
Myong

(10) Patent No.: US 8,642,373 B2
(45) Date of Patent: Feb. 4, 2014

(54) PHOTOVOLTAIC DEVICE INCLUDING AN INFLEXIBLE OR A FLEXIBLE SUBSTRATE AND METHOD FOR MANUFACTURING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 184 days.

(21) Appl. No.: 13/052,758

(22) Filed: Mar. 21, 2011

(65) Prior Publication Data

US 2012/0067409 A1   Mar. 22, 2012

(30) Foreign Application Priority Data

Mar. 22, 2010   (KR) .................. 10-2010-0025467

(51) Int. Cl.
*H01L 21/00* (2006.01)

(52) U.S. Cl.
USPC .................. 438/72; 438/69; 438/73; 438/74; 438/87; 257/E31.032; 257/E31.061; 136/246; 136/255; 136/259

(58) Field of Classification Search
None
See application file for complete search history.

(56) References Cited

U.S. PATENT DOCUMENTS

| | | | | |
|---|---|---|---|---|
| 4,165,241 A | * | 8/1979 | Yerkes et al. | 136/256 |
| 5,180,686 A | * | 1/1993 | Banerjee et al. | 438/62 |
| 5,272,370 A | * | 12/1993 | French | 257/353 |
| 6,791,152 B2 | * | 9/2004 | Hwang et al. | 257/458 |
| 7,199,395 B2 | * | 4/2007 | Terakawa et al. | 257/52 |
| 7,550,665 B2 | * | 6/2009 | Sasaki et al. | 136/246 |
| 7,770,279 B2 | * | 8/2010 | Nguyen-Dinh et al. | 29/594 |
| 2005/0145972 A1 | | 7/2005 | Fukuda et al. | |
| 2011/0120537 A1 | * | 5/2011 | Liu et al. | 136/255 |
| 2011/0226318 A1 | | 9/2011 | Myong | |
| 2012/0067409 A1 | | 3/2012 | Myong | |
| 2012/0279553 A1 | * | 11/2012 | Shigeta et al. | 136/246 |
| 2013/0087200 A1 | * | 4/2013 | Xue et al. | 136/259 |

FOREIGN PATENT DOCUMENTS

| | | |
|---|---|---|
| CN | 101593779 | 12/2009 |
| JP | 02011060971 A * | 3/2011 |
| KR | 100876613 | 12/2008 |

OTHER PUBLICATIONS

Non-Final Office Action in U.S. Appl. No. 13/071,124 dated May 31, 2013.
Final Office Action dated Oct. 21, 2013 in U.S. Appl. No. 13/071,124.

* cited by examiner

*Primary Examiner* — Zandra Smith
*Assistant Examiner* — Khanh Duong
(74) *Attorney, Agent, or Firm* — H.C. Park & Associates, PLC

(57) ABSTRACT

Disclosed is a method for manufacturing a photovoltaic device that includes: providing a substrate having a first electrode formed thereon; forming a first unit cell, the first unit cell including a first conductive silicon layer, an intrinsic silicon layer and a second conductive silicon layer, which are sequentially stacked from the first electrode; exposing to the air either a portion of an intermediate reflector formed on the first unit cell or the second conductive silicon layer of the first unit cell; forming the rest of the intermediate reflector or the entire intermediate reflector on the second conductive silicon layer of the first unit cell in a second manufacturing system; and forming a second unit cell on the intermediate reflector in the second manufacturing system, the second unit cell including a first conductive silicon layer, an intrinsic silicon layer and a second conductive silicon layer, sequentially stacked.

17 Claims, 5 Drawing Sheets

US 8,642,373 B2

PHOTOVOLTAIC DEVICE INCLUDING AN INFLEXIBLE OR A FLEXIBLE SUBSTRATE AND METHOD FOR MANUFACTURING THE SAME

CROSS-REFERENCE TO RELATED APPLICATIONS

This application claims priority under 35 U.S.C. §119 to Korean Patent Application No. 10-201.0-0025467 filed on Mar. 22, 2010, which is hereby incorporated by reference.

FIELD OF THE INVENTION

The present invention is related to a photovoltaic device including an inflexible or a flexible substrate and a method for manufacturing the same.

BACKGROUND OF THE INVENTION

Recently, because of a high oil price and a global warming phenomenon based on a large amount $CO_2$ emission, energy is becoming the most important issue in determining the future life of mankind. Even though many renewable energy technologies including wind force, bio-fuels, a hydrogen/fuel cell and the like have been developed, a photovoltaic device using sunlight is in the spotlight in that solar energy, the origin of all energies, is an almost infinite clean energy source.

The sunlight incident on the surface of the earth has an electric power of 120,000 TW. Thus, theoretically, if a photovoltaic device having a photoelectric conversion efficiency of 10% covers only 0.16% of the land surface of the earth, it is possible to generate electric power of 20 TW that is twice as much as the amount of energy globally consumed during one year.

Actually, the world photovoltaic market has explosively grown by almost 40% of an annual growth rate for the last ten years. Now, a bulk-type silicon photovoltaic device occupies a 90% of the photovoltaic device market share. The bulk-type silicon photovoltaic device includes a single-crystalline silicon photovoltaic device and a multi-crystalline or a poly-crystalline silicon photovoltaic device and the like. However, productivity of a solar-grade silicon wafer which is the main material of the photovoltaic device is not able to till the explosive demand thereof so the solar-grade silicon wafer is globally in short supply. Therefore, this shortage of the solar-grade silicon wafer is a huge threatening factor in reducing the manufacturing cost of a photovoltaic device.

Contrary to this, a thin-film silicon photovoltaic device based on a hydrogenated amorphous silicon (a-Si:H) allows to reduce a thickness of a silicon layer equal to or less than $\frac{1}{100}$ as large as that of a silicon wafer of the bulk-type silicon photovoltaic device. Also, it makes possible to manufacture a large area photovoltaic device at a lower cost.

Meanwhile, a single-junction thin-film silicon photovoltaic device is limited in its achievable performance. Accordingly, a double junction thin-film silicon photovoltaic device or triple junction thin-film silicon photovoltaic device having a plurality of stacked unit cells has been developed, pursuing high stabilized efficiency.

The double junction or triple junction thin-film silicon photovoltaic device is referred to as a tandem-type photovoltaic device. The open circuit voltage of the tandem-type photovoltaic device corresponds to a sum of each unit cell's open circuit voltage. Short circuit current is determined by a minimum value among the short circuit currents of the unit cells. Regarding the tandem-type photovoltaic device, research is being devoted to an intermediate reflector which is capable of improving efficiency by enhancing internal reflection between the unit cells.

SUMMARY OF THE INVENTION

One aspect of the present invention is a method for manufacturing a photovoltaic device. The method includes: providing a substrate having a first electrode formed thereon; forming a first unit cell in a first manufacturing system, the first unit cell including a first conductive silicon layer, an intrinsic silicon layer and a second conductive silicon layer, which are sequentially stacked from the first electrode; exposing to the air either a portion of an intermediate reflector formed on the first unit cell or the second conductive silicon layer of the first unit cell; forming the rest of the intermediate reflector or the entire intermediate reflector on the second conductive silicon layer of the first unit cell in a second manufacturing system; and forming a second unit cell on the intermediate reflector in the second manufacturing system, the second unit cell including a first conductive silicon layer, an intrinsic silicon layer and a second conductive silicon layer, which are sequentially stacked.

Another aspect of this invention is a photovoltaic device. The photovoltaic device includes: a flexible substrate; a first electrode placed on the flexible substrate; a first unit cell being placed on the first electrode and including a first conductive silicon layer, an intrinsic silicon layer and a second conductive silicon layer; an intermediate reflector'being placed on the first unit cell and having a concentration of a non-silicon based element which is increased more the farther it is from a light incident side; a second unit cell being placed on the intermediate reflector and including a first conductive silicon layer, an intrinsic silicon layer and a second conductive silicon layer; and a second electrode on the second unit cell.

DETAILED DESCRIPTION

With reference to the drawings, a photovoltaic device and a method for manufacturing the same will be described.

Figure 1A:
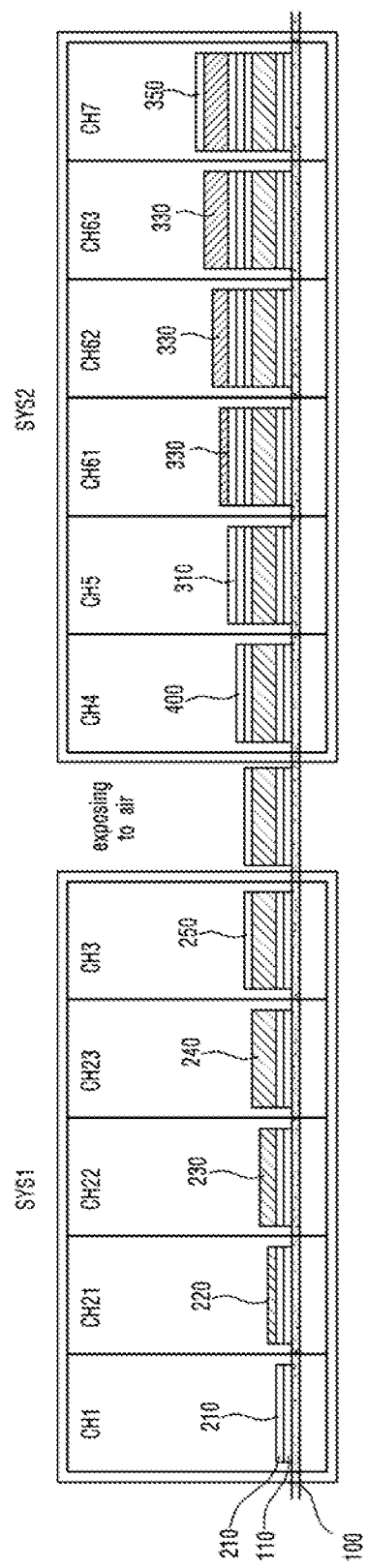
FIGS. 1a and 1b show a first manufacturing system and a second manufacturing system, which are used to manufacture a photovoltaic device according to an embodiment of the present invention.
Figure 1B:
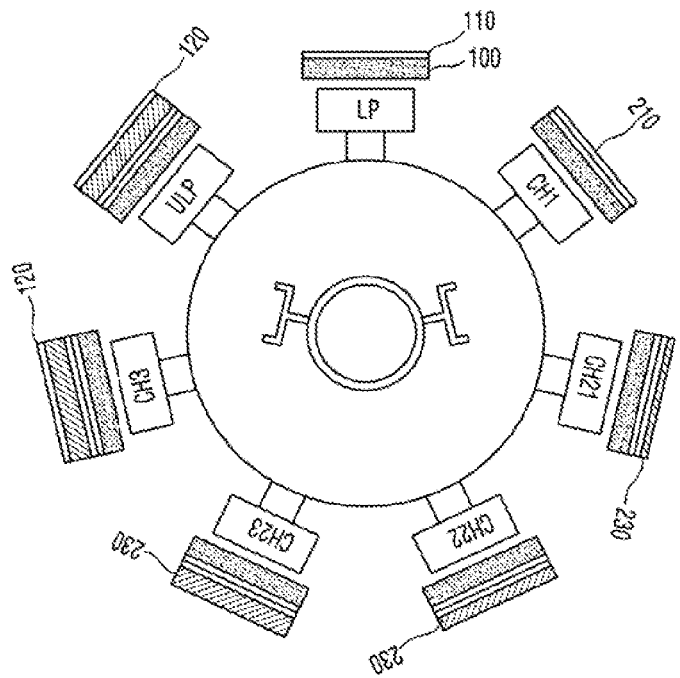
Figure 1B:
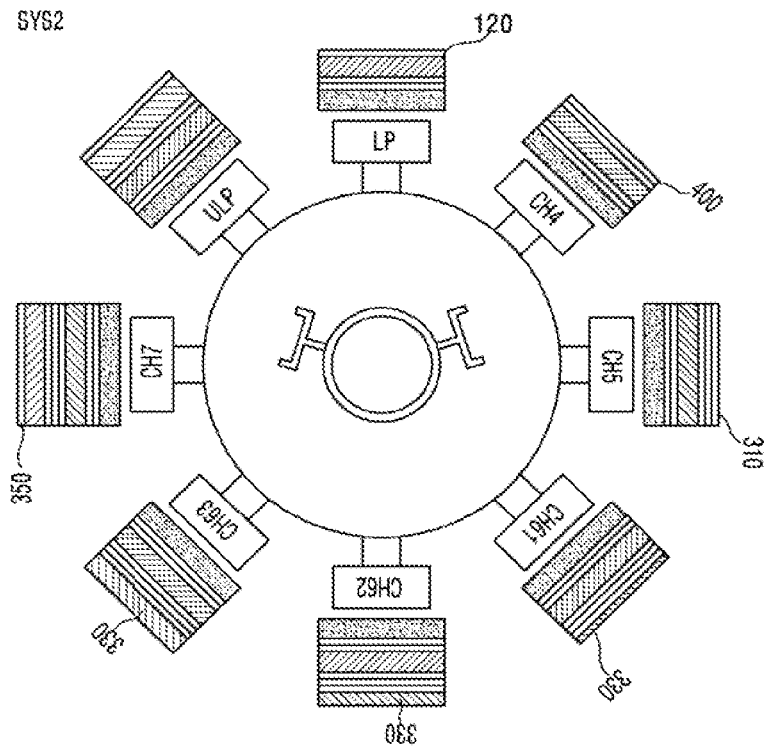

A photovoltaic device may include a double junction structure and a triple junction structure and the like. In FIGS. 1a and 1b, a photovoltaic device having, the double junction structure will be described as an example.

FIGS. 1a and 1b show a first manufacturing system and a second manufacturing system, which are used to manufacture a photovoltaic device according to an embodiment of the present invention. FIG. 1a shows a stepping roll type manufacturing system. FIG. 1b shows a cluster type manufacturing system. The stepping roll type manufacturing system is used to manufacture a photovoltaic device on a flexible substrate such as a metal foil or a polymer substrate. The cluster type manufacturing system is used to manufacture a photovoltaic device on an inflexible substrate such as a glass substrate. The method for manufacturing the photovoltaic device according to the embodiment of the present invention can be applied to not only the manufacturing systems shown in FIGS. 1a and 1b but also various manufacturing system, for example, a roll-to-roll type manufacturing system.

Process chambers CH1, CH21 to CH23, CH3, CH4, CH5, CH61 to CH63 and CH7 are isolated from the air, which are included in the first manufacturing system SYS1 and the second manufacturing system SYS2.

As shown in FIGS. 1a and 1b, a substrate 100 is provided, which has a first electrode 110 formed thereon. A first unit cell 200 is formed in the first manufacturing system SYS1. Here, the first unit cell 200 includes a first conductive silicon layer 210, an intrinsic silicon layer 230 and a second conductive silicon layer 250, which are sequentially stacked from the first unit cell 110.

The first conductive silicon layer 210 the intrinsic silicon layer 230 and the second conductive silicon layer 250 are formed in the process chambers CH1, CH21 to CH23 and CH3 of the first manufacturing system SYS1 respectively. Since the thickness of the intrinsic silicon layer 230 is larger than the thickness of the first conductive silicon layer 210 and the thickness of the second conductive silicon layer 250, the number of the process chambers CH21 to CH23 required for forming the intrinsic silicon layer 230 may be greater than the number of the process chamber required for forming the first conductive silicon layer 210 or the second conductive silicon layer 250.

When the first conductive silicon layer 210 and the second conductive silicon layer 250 correspond to a p-type silicon layer and an n-type silicon layer respectively, hydrogen gas, silane gas and group III impurities are introduced into the process chamber CH1. Hydrogen gas, silane gas and group V impurities are introduced into the process chamber CH3. When the first conductive silicon layer 210 and the second conductive silicon layer 250 correspond to an n-type silicon layer and a p-type silicon layer respectively, hydrogen gas, silane gas and group V impurities are introduced into the process chamber CH1. Hydrogen gas, silane gas and group III impurities are introduced into the process chamber CH3. The aforementioned impurities can be introduced to form a first conductive silicon layer 310 and second conductive silicon layer 350 of a second unit cell 300.

Here, the second conductive silicon layer 250 of the first unit cell 200 includes hydrogenated nanocrystalline silicon or hydrogenated amorphous silicon. For example, when the second conductive silicon layer 250 of the first unit cell 200 is an n-type silicon layer, the second conductive silicon layer 250 includes n-type hydrogenated nanocrystalline silicon or hydrogenated amorphous silicon. Additionally, when the second conductive silicon layer 250 of the first unit cell 200 is a p-type silicon layer, the second conductive silicon layer 250 includes p-type hydrogenated nanocrystalline silicon or hydrogenated amorphous silicon.

Either a portion of the intermediate reflector 400 formed on the first unit cell 200 or the second conductive silicon layer 250 of the first unit cell 200 is exposed to the air. That is, though not shown in the drawings, in the embodiment of the present invention, a portion of the intermediate reflector 400 is formed on the second conductive silicon layer 250 of the first unit cell 200 in the process chamber CH3 of the first manufacturing system SYS1. The rest portion of the intermediate reflector 400 is formed in the process chamber CH4 of the second manufacturing system SYS2. In addition, the entire intermediate reflector 400, as shown in FIGS. 1a and 1b, may be formed in the process chamber CH4 of the second manufacturing system SYS2, instead of being formed through the two procedures.

Here, the intermediate reflector 400 includes hydrogenated nanocrystalline silicon based material or hydrogenated amorphous silicon based material.

Meanwhile, when the first manufacturing system SYS1 and the second manufacturing system SYS2 is formed in the form of an integral system without separation, since the entire system including the first manufacturing system SYS1 and the second manufacturing system SYS2 should be maintained in a vacuum state, the price and maintenance costs of the system may be increased. Further, since the first manufacturing system SYS1 and the second manufacturing system SYS2 are not separated, the volume of the entire system may be increased.

On the other hand, FIGS. 1a and 1b show that the first manufacturing system SYS1 and the second manufacturing system SYS2 are separated. Therefore, the first unit cell 200 or a portion of the intermediate reflector 400 is exposed to the air in order to transfer the substrate 100 to the second manufacturing system SYS2. Since the first manufacturing system SYS1 and the second manufacturing system SYS2 are separated with each other, it is possible to reduce the manufacturing cost of the photovoltaic device, to apply the manufacturing systems SYS1 and SYS2 more variously, and to efficiently utilize a space in which the manufacturing systems SYS1 and SYS2 are installed.

After the first unit cell 200 and a portion of the intermediate reflector 400 are exposed to the air, the rest of the intermediate reflector 400 is formed on the portion of the intermediate reflector 400 which has been already formed in the process chamber CH4 of the second manufacturing system SYS2. Also, the entire intermediate reflector 400 may be formed on the second conductive silicon layer 250 of the second unit cell 200 in the process chamber CH4 of the second manufacturing system SYS2.

Here, the intermediate reflector 400 can be formed by two methods. The process chamber can deposit the intermediate reflector 400 or diffuse non-silicon based element.

One method is as follows. The intermediate reflector 400 having a predetermined thickness is deposited on the second conductive silicon layer 250 of the second unit cell 200. When the intermediate reflector 400 is deposited, not only hydrogen gas, silane gas and impurity gas but also gas including non-silicon based element are introduced into the process chamber CH3 or the process chamber CH4.

The other method is as follows. After the second conductive silicon layer 250 of the second unit cell 200 is formed, non-silicon based element is diffused onto the second conductive silicon layer 250, so that the area in which the non-silicon based element has been diffused is able to function as the intermediate reflector 400. Plasma within the process chamber CH3 or the process chamber CH4 decomposes the gas including the non-silicon based element and diffuses non-silicon based element such as oxygen atoms, carbon atoms or nitrogen atoms.

By mixing group III impurity gas or group V impurity gas with the gas including the non-silicon based element, the intermediate reflector 400 including the hydrogenated nanocrystalline silicon based material or the hydrogenated amorphous silicon based material is formed. For example, when the first unit cell 200 includes the p-type silicon layer 210, the intrinsic silicon layer 230 and the n-type silicon layer 250, which are sequentially stacked from the first electrode 110 the group V impurity gas is introduced into the process chamber CH4 during the forming of the intermediate reflector 400. Therefore, the intermediate reflector 400 includes n-type hydrogenated nanocrystalline silicon based material or the hydrogenated amorphous silicon based material. When the first unit cell 200 includes the n-type silicon layer 210, the intrinsic silicon layer 230 and the p-type silicon layer 250, which are sequentially stacked from the first electrode 110, the group III impurity gas is introduced into the process chamber CH4 during the forming of the intermediate reflector 400. Therefore, the intermediate reflector 400 includes p-type hydrogenated nanocrystalline silicon based material or the hydrogenated amorphous silicon based material.

Here, the concentration of the non-silicon based element of the intermediate reflector 400 can be maintained constant or be increased more the farther it is from a light incident side.

Figure 2:
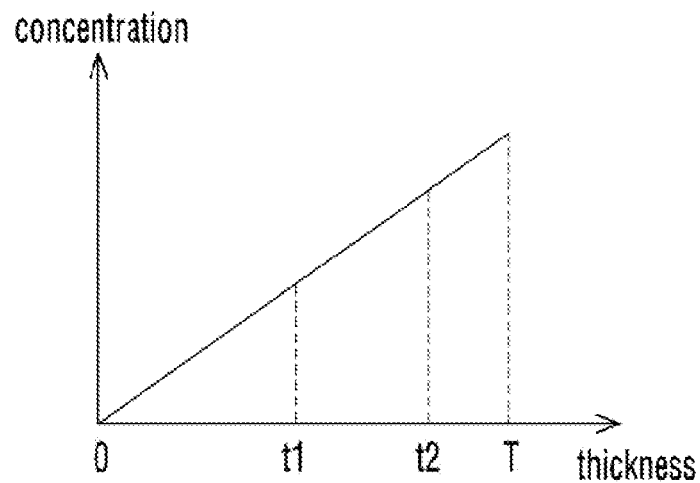
FIG. 2 shows a concentration profile of an intermediate reflector of the photovoltaic device according to an embodiment of the present invention.

It is considered that the concentration of the non-silicon based element is increased more the farther it is from a light incident side. As shown in FIG. 2, assuming that the total thickness of the intermediate reflector 400 is T and a point "t2" of the intermediate reflector 400 is farther from the light incident side than a point of "t1" of the intermediate reflector 400, the concentration of the non-silicon based element at the point "t2" of the intermediate reflector 400 is greater than the concentration of the non-silicon based element at the point "t1" of the intermediate reflector 400.

For example, in case of a p-i-n type photovoltaic device, since light is incident through the substrate 100 and the first electrode 110, the concentration of the non-silicon element of the intermediate reflector 400 is profiled to be increased more the farther it is from the substrate 100. In case of an n-i-p type photovoltaic device, since light is incident from an opposite side to the substrate 100 like a second electrode 120, the concentration or the non-silicon element of the intermediate reflector 400 is profiled to be increased more the farther it is from the opposite side to the substrate 100.

In the embodiment of the present invention, the non-silicon based element may correspond to oxygen, carbon or nitrogen. The intermediate reflector 400 hereby includes hydrogenated nanocrystalline silicon oxide or hydrogenated amorphous silicon oxide, hydrogenated nanocrystalline silicon carbide or hydrogenated amorphous silicon carbide, hydrogenated nanocrystalline silicon nitride or hydrogenated amorphous silicon nitride. $CO_2$ or $O_2$ can be used as gas including oxygen introduced into the process chamber CH4. $CH_4$, $C_2H_4$ or $C_2H_2$ can be used as gas including carbon introduced into the process chamber CH4. $NH_4$, $N_2O$ or NO can be used as gas including nitrogen introduced into the process chamber CH4.

After the intermediate reflector 400 is formed, a second unit cell 300 is formed. The second unit cell 300 includes a first conductive silicon layer 310, an intrinsic silicon layer 330 and a second conductive silicon layer 350, which are sequentially stacked on the intermediate reflector 400. Here, the first conductive silicon layer 310 and the second conductive silicon layer 350 are formed in the process chamber CH5 and the process chamber CH7 respectively. The intrinsic silicon layer 330 is formed in the process chambers CH61 to CH63.

As described in the embodiment of the present invention, when the second conductive silicon layer 250 of the first unit cell 200 includes hydrogenated nanocrystalline silicon and the intermediate reflector 400 includes hydrogenated nanocrystalline silicon based material, a crystal volume fraction is prevented from being rapidly reduced at an interface between the second conductive silicon layer 250 and the intermediate reflector 400, so that a vertical electrical conductivity is prevented from being degraded. The thickness of the second conductive silicon layer 250 of the first unit cell 200 is equal to or more than 5 nm and is equal to or less than 30 nm. When the thickness of the second conductive silicon layer 250 is equal to or more than 5 nm, a fill factor of the photovoltaic device is prevented from being excessively reduced. When the thickness of the second conductive silicon layer 250 is equal to or less than 30 nm, light is prevented from being excessively absorbed by the second conductive silicon layer 250.

Further, as described in the embodiment of the present invention, when the intermediate reflector 400 includes the hydrogenated amorphous silicon based material, deposition rate of the intermediate reflector 400 becomes higher, so that it is possible to reduce the manufacturing process time of the photovoltaic device.

Additionally, since the concentration of the non-silicon based element of the intermediate reflector 400 is increased more the farther it is from a light incident side, a refractive index or optical band gap is continuously changed at an interface between the second conductive silicon layer 250 of the first unit cell 200 and the intermediate reflector 400. Therefore, a defect density at a heterojunction interface between the second conductive silicon layer 250 of the first unit cell 200 and the intermediate reflector 400 is prevented from being abruptly increased, so that light is minimally absorbed by the intermediate reflector 400.

When the first unit cell 200 or a portion of the intermediate reflector 400 is exposed to the air after the first unit cell 200 is formed, there is a possibility that either the portion of the intermediate reflector 400 or the second conductive silicon layer 250 of the first unit cell 200 is contaminated. Therefore, before the intermediate reflector 400 is formed in the process chamber CH4 of the second manufacturing system SYS2, a dry etching process may be performed in order to remove the contaminated area.

Accordingly, after the portion of the intermediate reflector 400 is exposed to the air, the dry etching is performed on the surface of the portion of the intermediate reflector 400. Moreover, after the second conductive silicon layer 250 of the first unit cell 200 is exposed to the air, the surface of the second conductive silicon layer 250 of the first unit cell 200 is dry etched.

The dry etching process may reduce the influence on a flexible substrate 100. That is, a chemical etching may damage the flexible substrate 100 made of a polymer or a metal foil or transform the appearance of the substrate. Contrary to this, since the dry etching process has a little influence on the flexible substrate 100, the photovoltaic device is able to stably operate.

The dry etching is performed by hydrogen plasma. The etching process is performed in the process chamber CH4 in which the intermediate reflector 400 is formed or in a separate process chamber. When the etching process is performed in the process chamber CH4 in which the intermediate reflector 400 is formed, the second manufacturing system SYS2 can be easily configured. Accordingly, the etching process and the formation of the rest of the intermediate reflector 400 are performed in one process chamber. Also, the etching process and the formation of the entire intermediate reflector 400 may be performed in one process chamber.

During the dry etching process, impurity gas may be introduced into the process chamber. When the etching process is being performed, impurities in the second conductive silicon layer 250 of the first unit cell 200 flow out by the hydrogen plasma, so that the electrical conductivity of the first unit cell 200 is reduced. Therefore, the impurity gas introduced during the dry etching process is capable of compensating for the impurities flowing out due to the etching process.

Figure 3:
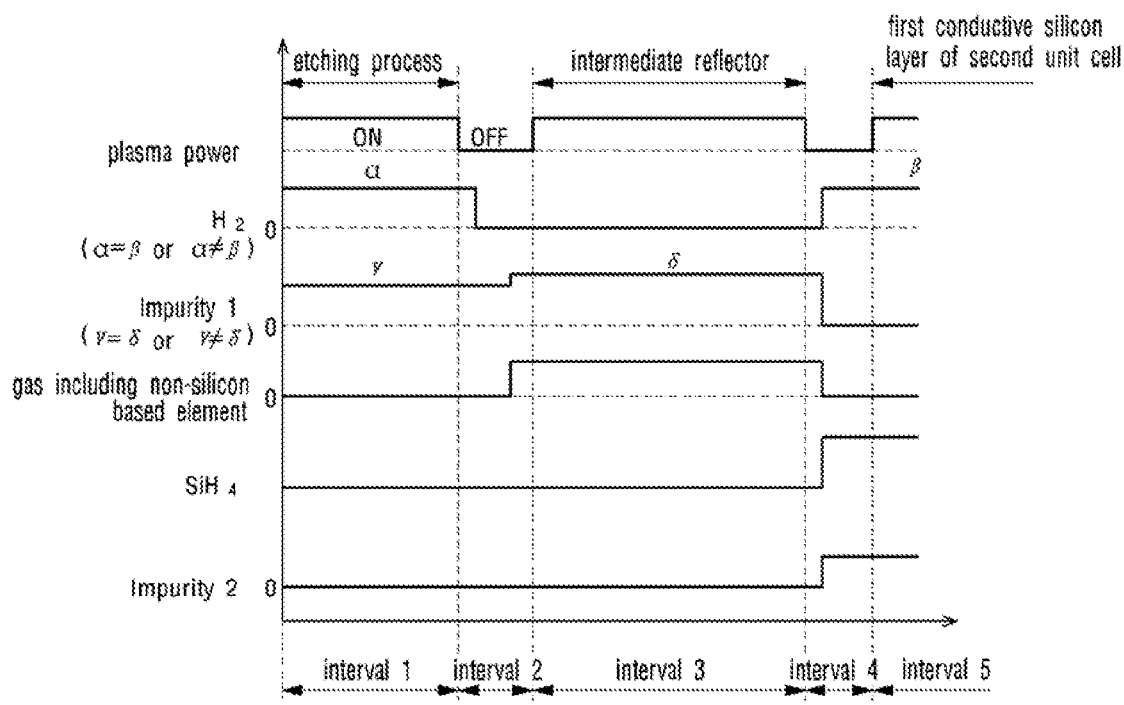
FIG. 3 shows flow rate changes of gases in accordance with an embodiment of the present invention.

In the etching process and in the formation of both the intermediate reflector 400 and the first conductive silicon layer 310 of the second unit cell 300, in order to minimize the increase of the processing time, gases are introduced into one process chamber as shown in FIG. 3. In other words, while FIGS. 1a and 1b show that the first conductive silicon layer 310 of the second unit cell 300 and the intermediate reflector 400 are formed in the process chamber CH4 and the process chamber CH5 respectively, FIG. 3 shows that the etching process and the formation of both the intermediate reflector 400 and the first conductive silicon layer 310 of the second unit cell 300 are performed in one process chamber.

FIG. 3 shows flow rate changes of gases for manufacturing the photovoltaic device according to the embodiment of the present invention. FIG. 3 shows flow rate changes when the intermediate reflector 400 is formed through the diffusion of non-silicon based element. A plasma power for making hydrogen gas in a plasma state is supplied into the process chamber during an interval 1 and hydrogen gas is introduced into the process chamber. Here, the etching process is hereby performed. Here, impurity 1 is introduced into the process chamber in order to compensate for the impurity of the second conductive silicon layer 250, which flows out during the etching process. If the second conductive silicon layer 250 is an n-type silicon layer, the impurity 1 includes group V element. If the second conductive silicon layer 250 is a p-type silicon layer, the impurity 1 includes group III element.

During an interval 2, the plasma power is turned off and the impurity 1 is continuously supplied. Since the impurity 1 is required during the process of forming the intermediate reflector 400, the impurity 1 is also continuously introduced during the interval 2. Besides, gas including the non-silicon based element is started to be supplied during the interval 2. This intends to prevent the flow rate of the gas including the non-silicon based element from being rapidly changed when the plasma power is supplied during an interval 3 so as to diffuse the non-silicon based element.

During the interval 3, the plasma power is turned on and the impurity 1 is continuously supplied. Here, the flow rate of the impurity 1 may be equal to or not equal to the flow rate of the impurity 1 which has been supplied during the interval 1. Besides, the gas including the non-silicon based element is introduced into the process chamber. As shown in FIG. 3, the flow rate of the gas including the non-silicon based element is maintained constant during the interval 3. As described above, the flow rate of the gas including the non-silicon based element may be changed during the interval 3 such that the concentration of the non-silicon based element varies depending on a position within the intermediate reflector 400.

After the intermediate reflector 400 is formed by diffusing the non-silicon based element, during an interval 4, the plasma power is turned off and the impurity 1 and the gas including the non-silicon based element are stopped being introduced. Hydrogen gas, silane gas and impurity 2 are also introduced into the process chamber during the interval 4 in order to form the first conductive silicon layer 310 of the second unit cell 300. This intends to prevent the flow rates of the gases within the process chamber from being rapidly changed when the first conductive silicon layer 310 of the second unit cell 300 is formed during an interval 5.

During the interval 5, the plasma power is turned on and hydrogen gas, silane gas and impurity 2 are introduced, so that the first conductive silicon layer 310 of the second unit cell 300 is deposited on the intermediate reflector 400. The intermediate reflector 400 has an average refractive index equal to or more than 1.7 and equal to or less than 2.5 at a wavelength of 600 nm. When the refractive index of the intermediate reflector 400 is equal to or more than 1.7, conductivity thereof is increased and a fill factor (FF) of a multi-junction photovoltaic device, is improved. Therefore, efficiency is increased. When the refractive index of the intermediate reflector 400 is equal to or less than 2.5, light of a wavelength equal to or less than 600 nm is easily reflected and short-circuit current is increased, so that efficiency is increased.

Figure 4:
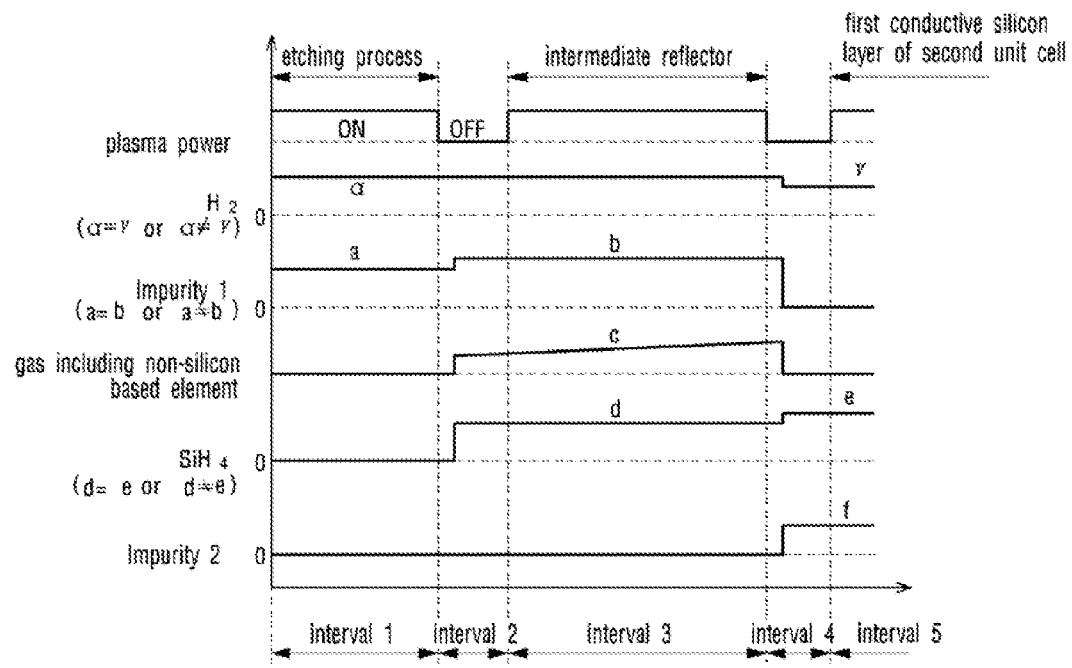
FIG. 4 shows other flow rate changes of gases in accordance with an embodiment of the present invention.

FIG. 4 shows other flow rate changes of gases in accordance with the embodiment of the present invention. FIG. 4 shows flow rate changes when the etching process and the formation of both the intermediate reflector 400 and the first conductive silicon layer 310 of the second unit cell 300 by deposition are performed in one process chamber.

A plasma power for making hydrogen gas in a plasma state is supplied into the process chamber during an interval 1 and hydrogen gas is introduced into the process chamber. The etching process is hereby performed. Here, impurity 1 is introduced into the process chamber in order to compensate for the impurity of the second conductive silicon layer 250, which flows out during the etching process.

During an interval 2 the plasma power is turned off and the impurity 1 and hydrogen gas are continuously supplied. Since the impurity 1 is required during the process of forming the intermediate reflector 400, the impurity 1 is also continuously introduced during the interval 2. Besides, silane gas and gas including the non-silicon based element is started to be supplied during the interval 2. The reason why the hydrogen gas, silane gas and gas including the non-silicon based element are supplied during the interval 2 is to prevent the flow rates of the gases from being rapidly changed when the intermediate reflector 400 is formed during an interval 3 by deposition.

During the interval 3, the plasma power is turned on and the impurity 1 is continuously supplied. Here, the flow rate of the impurity 1 may be equal to or not equal to the flow rate of the impurity 1 which has been supplied during the interval 1. Besides, silane gas, hydrogen gas and gas including the non-silicon based element are introduced into the process chamber. The flow rate of the gas including the non-silicon based element may be maintained constant during the interval 3. As shown in FIG. 4, the flow rate of the gas including the non-silicon based element is changed during the interval 3 such that the concentration of the non-silicon based element varies depending on a position within the intermediate reflector 400.

Figure 5:
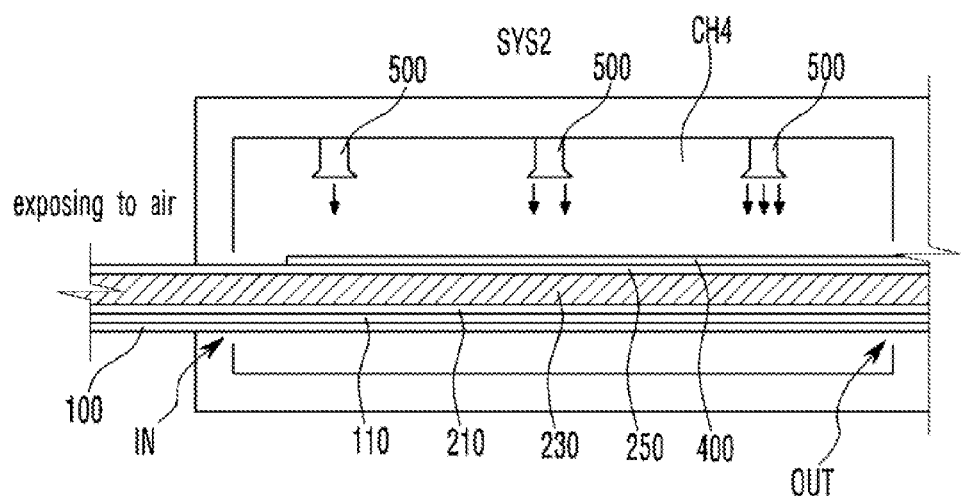
FIG. 5 shows an intermediate reflector formed by a roll-to-roll type manufacturing system.

As described above, the flow rate of the gas including the non-silicon based element changes in order to cause the concentration of the non-silicon based element of the intermediate reflector 400 to be increased more the farther it is from a light incident side. In FIG. 4, the flow rate of gas including the non-silicon based element, which gradually changes, may be difficult to be applied to a roll-to-roll type manufacturing system SYS2. That is, as shown in FIG. 5, since the roll-to-roll type manufacturing system SYS2 includes process chambers which are not separated from each other, the substrate 100 is continuously transferred.

As a result, in the a roll-to-roll type manufacturing system SYS2, in order that the concentration of the non-silicon based element of the intermediate reflector 400 changes, the flow rate of the gas including the non-silicon based element in the area adjacent to the outlet of the process chamber CH4 is greater than the flow rate of the gas including the non-silicon based element in the area adjacent to the inlet of the process chamber CH4. For the purpose of inducing the aforementioned change of the flow rate, the flow rate of a nozzle 500 adjacent to the outlet of the process chamber CH4 is greater than the flow rate of a nozzle 500 adjacent to the inlet of the process chamber CH4.

Moreover, though not shown in the drawings, the flow rate of the nozzle 500 adjacent to the outlet of the process chamber CH4 may be less than the flow rate of the nozzle 500 adjacent to the inlet of the process chamber CH4.

As such, the amount of the flow rate of the gas including the non-silicon based element in the areas adjacent to the inlet and outlet of the process chamber CH4 changes according to either a p-i-n type photovoltaic device or an n-i-p type photovoltaic device.

Though not shown in the drawings, both when the roll-to-roll type manufacturing system includes a plurality of the process chambers for forming the intermediate reflector 400 and when the flow rates of gases including the non-silicon based element introduced into each of the process chambers become different from each other, the concentration of the non-silicon based element of the intermediate reflector 400 can be increased more the farther it is from a light incident side.

After the formation of the intermediate reflector 400 is completed by deposition, during an interval 4, the plasma power is turned off and the impurity 1 and the gas including the non-silicon based element are stopped being introduced. Hydrogen gas, silane gas and impurity 2 are also introduced into the process chamber during the interval 4 in order to form the first conductive silicon layer 310 of the second unit cell 300. This intends to prevent the flow rates of the gases within the process chamber from being rapidly changed when the first conductive silicon layer 310 of the second unit cell 300 is formed during an interval 5.

During the interval 5, the plasma power is turned on and hydrogen gas, silane gas and impurity 2 are introduced, so that the first conductive silicon layer 310 of the second unit cell 300 is deposited on the intermediate reflector 400.

As shown in FIGS. 3 and 4, in order to form both the intermediate reflector 400 and the first conductive silicon layer 310 of the second unit cell 300 in one process chamber, a pressure within the process chamber may be maintained constant during which both the intermediate reflector 400 and the first conductive silicon layer 310 of the second unit cell 300 are formed.

Figure 6:
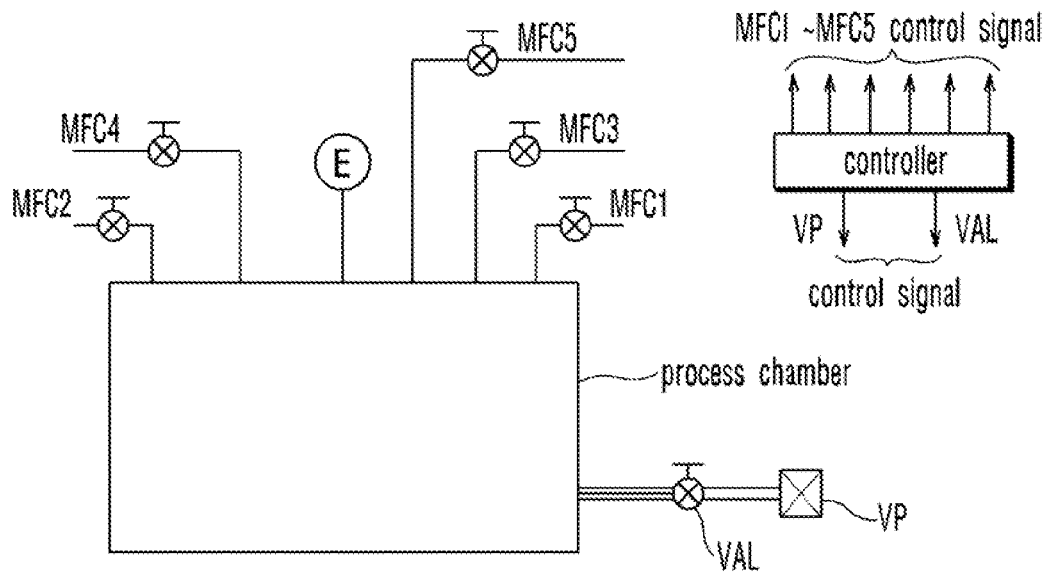
FIG. 6 shows a process chamber of the second manufacturing system.

In other words, as shown in FIG. 6, for the purpose of maintaining the pressure within the process chamber constant, a controller controls a plurality of mass flow controllers MFC1 to MFC5 and a gas emission valve VAL, so that a difference between the flow rate of gases introduced into the process chamber and the flow rate of gases emitted from the process chamber is maintained constant. As a result, the pressure within the process chamber is maintained constant. Here, a plurality of the mass flow controllers MFC1 to MFC5 control the flow rates of the hydrogen gas, silane gas, impurity 1, impurity 2 and gas including the non-silicon based element. The gas emission valve VAL controls the flow rate of gas emitted from the process chamber. A vacuum pump VP is connected to the gas emission valve VAL and allows the gas to be emitted from the process chamber.

Through these processes, the photovoltaic device according to the embodiment of the present invention includes the flexible substrate 100, the first electrode 110, the second electrode 120, the first unit cell 200, the second unit cell 300 and the intermediate reflector 400.

The first electrode 110 and the second electrode 120 are placed on the flexible substrate 100.

The first unit cell 200 is located between the first electrode 110 and the second electrode 120, and includes the first conductive silicon layer 210, the intrinsic silicon layer 230 and the second conductive silicon layer 250, which are sequentially stacked from the first electrode 110.

The second unit cell 300 is located between the first unit cell 200 and the second electrode 120, and includes the first conductive silicon layer 310, the intrinsic silicon layer 330 and the second conductive silicon layer 350, which are sequentially stacked from the first unit cell 200.

The intermediate reflector 400 is placed between the first unit cell 200 and the second unit cell 300, and has a concentration of the non-silicon based element which is increased more the farther it is from a light incident side. Here, the intermediate reflector 400 may include hydrogenated nanocrystalline silicon based material or hydrogenated amorphous silicon based material.

As described above, the dry etching process for removing the contaminated area caused by atmospheric exposure has a little influence on the flexible substrate 100. Therefore, the method for manufacturing the photovoltaic device according to the embodiment of the present invention can be applied to manufacture of a photovoltaic device including the intermediate reflector 400, the flexible substrate 100 and a plurality of the unit cells 200 and 300.

The intermediate reflector 400 has an average refractive index equal to or more than 1.7 and equal to or less than 2.5 at a wavelength of 600 nm. When the refractive index of the intermediate reflector 400 is equal to or more than 1.7, conductivity thereof is increased and a fill factor (FF) of a multi junction photovoltaic device is improved. Therefore, efficiency is increased. When, the refractive index of the intermediate reflector 400 is equal to or less than 2.5, light having a wavelength equal to or less than 600 nm is easily reflected and short-circuit current is increased, so that efficiency is increased.

When the intermediate reflector 400 is made of hydrogenated nanocrystalline silicon based material, an average non-silicon based element content of the intermediate reflector 400 is equal to or more than 5 atomic % and equal to or less than 50 atomic %. When the average non-silicon based element content of the intermediate reflector 400 is equal to or more than 5 atomic %, the refractive index of the intermediate reflector 400 is equal to or less than 2.5 at a wavelength of 600 nm, so that internal reflection is prevented from being reduced. When the average non-silicon based element content of the intermediate reflector 400 is equal to or less than 50 atomic %, electrical conductivity is prevented from being reduced, so that photoelectric conversion efficiency is prevented from being reduced.

The intermediate reflector 400 made of hydrogenated nanocrystalline silicon based material has an average refractive index equal to or more than 1.7 and equal to or less than 2.5 at a wavelength of 600 nm due to not only the non-silicon based element but also the hydrogenated nanocrystalline silicon based material. When the intermediate reflector 400 is made of hydrogenated amorphous silicon based material, the refractive index of the intermediate reflector 400 is much affected by the non-silicon based element. Therefore, in order to obtain the average refractive index equal to or more than 1.7 and equal to or less than 2.5 at a wavelength of 600 nm, the average non-silicon based element content of the intermediate reflector 400 may be increased and is equal to or more than 30 atomic % and equal to or less than 70 atomic %.

An average hydrogen content of the intermediate reflector 400 is equal to or more than 10 atomic % and equal to or less than 25 atomic %. When the average hydrogen content of the intermediate reflector 400 is equal to or more than 10 atomic %, dangling bond is passivated, so that recombination is reduced. When the average hydrogen content of the intermediate reflector 400 is equal to or less than 25 atomic %, the defect of the intermediate reflector 400 can be prevented from being excessively increased.

A crystal volume fraction of the intermediate reflector 400 is equal to or more than 4% and equal to or less than 30%. When the crystal volume fraction of the intermediate reflector 400 is equal to or more than 4%, it is possible to prevent the increase of resistance due to the excessive amorphization of the intermediate reflector 400. When the crystal volume fraction of the intermediate reflector 400 is equal to or less than 30%, the intermediate reflector 400 is formed, which has a refractive index of 2.5 at a wavelength of 600 nm.

In the embodiment of the present invention, the total thickness of the intermediate reflector 400 is equal to or more than 10 nm and equal to or less than 200 nm. When the total thickness of the intermediate reflector 400 is equal to or more than 10 nm, internal reflection is produced. When the total thickness of the intermediate reflector 400 is equal to or less than 200 nm, it is possible to prevent the intermediate reflector 400 from excessively absorbing light.

As described above, the intermediate reflector 400 can be formed by two methods. That is, a portion of the intermediate reflector 400 is formed, and the rest of the intermediate reflector 400 is deposited on the portion of the intermediate reflector 400. As a result, the intermediate reflector 400 is formed. Otherwise, the entire intermediate reflector 400 is formed on the second conductive silicon layer 250. The intermediate reflector 400 formed by using one of the two methods above has its characteristics such as the refractive index, the average non-silicon based element content, the average hydrogen content and the crystal volume fraction.

Figure 7:
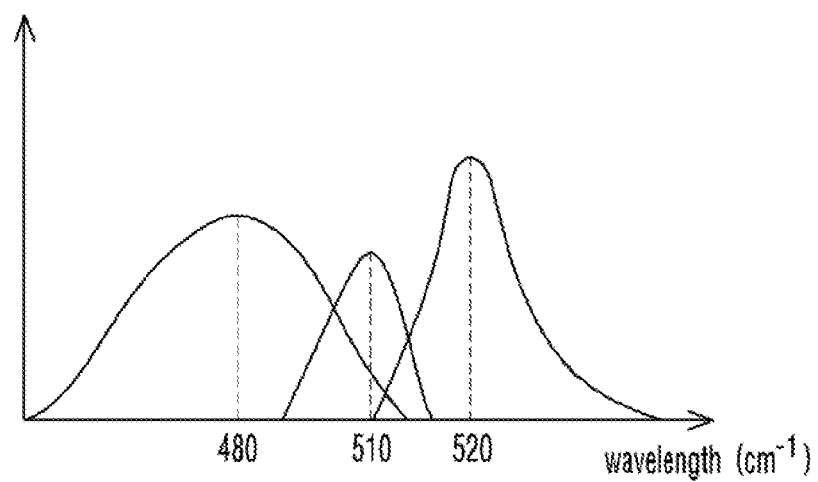
FIG. 7 shows the result of Raman analysis of the intermediate reflector manufactured according to an embodiment of the present invention.

FIG. 7 is a graph for describing a process of calculating a crystal volume fraction.

The crystal volume fraction can be represented by the following equation.

crystal volume fraction(%)=[($A_{510}+A_{520}$)/($A_{480}+A_{510}+A_{520}$)]*100

Here, $A_i$ means an area of a component peak in the vicinity of i cm$^{-1}$.

In other words, three peaks shown in FIG. 7 are obtained by performing Raman spectroscopy on the intermediate reflector 400 manufactured according to the embodiment of the present invention. The area of the component peak in the vicinity of 480 cm$^{-1}$ is obtained by means of Gaussian peak fitting in amorphous silicon TO-mode. The area of the component peak in the vicinity of 510 cm$^{-1}$ is obtained by means of Lorentzian peak fitting depending on a small grain or grain boundary defect. The area of the component peak in the vicinity of 520 cm$^{-1}$ is obtained by means of Lorentzian peak fitting in crystalline silicon TO-mode.

As described above, after the substrate 100 on which the first unit cell 200 has been formed is exposed to the air, the second unit cell 300 is formed in a separate manufacturing system. Accordingly, in the embodiment of the present invention, it is possible to efficiently apply the manufacturing system for the photovoltaic device including the intermediate reflector.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for manufacturing a photovoltaic device, the method comprising:
    providing a substrate having a first electrode formed thereon;
    forming a first unit cell in a first manufacturing system, the first unit cell including a first conductive silicon layer, an intrinsic silicon layer and a second conductive silicon layer, which are sequentially stacked from the first electrode;
    exposing to the air either a portion of an intermediate reflector formed on the first unit cell or the second conductive silicon layer of the first unit cell;
    forming the rest of the intermediate reflector or the entire intermediate reflector on the second conductive silicon layer of the first unit cell in a second manufacturing system; and
    forming a second unit cell on the intermediate reflector in the second manufacturing system, the second unit cell including a first conductive silicon layer, an intrinsic silicon layer and a second conductive silicon layer, which are sequentially stacked.

2. The method of claim 1, wherein the intermediate reflector is profiled such that a concentration of non-silicon based element in the intermediate reflector is increased more the farther it is from a light incident side.

3. The method of claim 1, wherein the intermediate reflector is formed by being deposited on the second conductive silicon layer of the first unit cell or by diffusing non-silicon based element onto the second conductive silicon layer of the first unit cell.

4. The method of claim 1, wherein, after the portion of the intermediate reflector is exposed to the air, the surface of the portion of the intermediate reflector is dry etched.

5. The method of claim 4, wherein the dry etching is performed by hydrogen plasma.

6. The method of claim 4, wherein impurity gas is introduced during the dry etching.

7. The method of claim 6, wherein, when the second conductive silicon layer is an n-type silicon layer, the impurity gas comprises group V elements, and wherein, when the second conductive silicon layer is a p-type silicon layer, the impurity gas comprises group III elements.

8. The method of claim 4, wherein the dry etching and the formation of the rest of the intermediate reflector are performed in one process chamber.

9. The method of claim 8, wherein a pressure within the one, process chamber is maintained constant during the formation of both the intermediate reflector and the first conductive silicon layer of the second unit cell.

10. The method of claim 4, wherein the dry etching and the formation of both the intermediate reflector and the first conductive silicon layer of the second unit cell are performed in one process chamber.

11. The method of claim 10, wherein a pressure within the one process chamber is maintained constant during the dry etching and the formation of both the intermediate reflector and the first conductive silicon layer of the second unit cell.

12. The method of claim 1, wherein, after the second conductive silicon layer of the first unit cell is exposed to the air, the surface of the second conductive silicon layer of the first unit cell is dry etched.

13. The method of claim 12, wherein the dry etching and the formation of the entire intermediate reflector are performed in one process chamber.

14. The method of claim 13, wherein a pressure within the one process chamber is maintained constant during the formation of both the intermediate reflector and the first conductive silicon layer of the second unit cell.

15. The method of claim 12, wherein the dry etching is performed by hydrogen plasma.

16. The method of claim 12, wherein impurity gas is introduced during the dry etching.

17. The method of claim 12, wherein the dry etching and the formation of both the intermediate reflector and the first conductive silicon layer of the second unit cell are performed in one process chamber.

* * * * *